United States Patent [19]
Hee et al.

[11] Patent Number: 6,014,417
[45] Date of Patent: Jan. 11, 2000

[54] ON-CHIP PHASE STEP GENERATOR FOR A DIGITAL PHASE LOCKED LOOP

[75] Inventors: Wong Hee, San Jose; Gabriel Li, San Francisco, both of Calif.

[73] Assignee: National Semiconductor Corporation, Santa Clara, Calif.

[21] Appl. No.: 08/920,498

[22] Filed: Aug. 29, 1997

Related U.S. Application Data

[63] Continuation-in-part of application No. 08/873,118, Jun. 11, 1997, Pat. No. 5,943,379.

[51] Int. Cl.[7] .............................. H03D 3/24; H04L 25/36; H04L 25/40; H04L 7/00
[52] U.S. Cl. ......................... 375/374; 375/371; 375/373; 375/375; 375/376; 375/226; 375/327; 327/156; 327/160
[58] Field of Search ..................... 375/226, 376, 375/375, 374, 373, 371, 327; 327/156, 160

[56] References Cited

U.S. PATENT DOCUMENTS

| | | | |
|---|---|---|---|
| 4,376,268 | 3/1983 | Moriya et al. ............................. | 331/10 |
| 5,056,054 | 10/1991 | Wong et al. ...................... | 364/724.011 |
| 5,224,125 | 6/1993 | Wong et al. .............................. | 375/328 |
| 5,351,275 | 9/1994 | Wong et al. .............................. | 375/376 |
| 5,646,967 | 7/1997 | Hee et al. ................................ | 375/373 |
| 5,651,036 | 7/1997 | Hee et al. ................................ | 375/374 |
| 5,943,379 | 8/1999 | Wong et al. ............................. | 375/374 |

*Primary Examiner*—Stephen Chin
*Assistant Examiner*—Michael W. Maddox
*Attorney, Agent, or Firm*—Limbach & Limbach LLP

[57] ABSTRACT

A method and circuitry are provided for generating a phase shift in the recovered clock in a high speed, digital data recovery phase locked loop. Since phase step injection can be done in a closed loop environment, the dynamic of the real time phase step response of the PLL can be analyzed using a phase meter. In an open-loop environment, the output of the phase meter with a step response of 60 degree phase shift tracks closely with the internal RC response at the multi-phase outputs of the PLL's phase-to-frequency converter. Since the register and capacitor values vary with process, the scheme for verifying the relative accuracy of the PLL's internal filters can be verified without actually probing the device.

6 Claims, 7 Drawing Sheets

Microfiche Appendix Included
(1 Microfiche, 15 Pages)

ON-CHIP PHASE STEP GENERATOR FOR A DIGITAL PHASE LOCKED LOOP

RELATED APPLICATION

This application is Continuation-In-Part of commonly-assigned application Ser. No. 08/873,118, filed Jun. 11, 1997 now U.S. Pat. No. 5,943,379, issued Aug. 24, 1999, titled "MULTI-PHASE TRAPEZOIDAL WAVE SYNTHESIZER USED IN PHASE-TO-FREQUENCY CONVERTER", which application is hereby incorporated by reference in its entirety to provide additional background information regarding the present invention.

MICROFICHE APPENDIX/COPYRIGHT NOTICE

This application includes an Appendix A in microfiche form. Portions of the microfiche Appendix A contain unpublished material which is subject to copyright protection. The copyright owner, National Semiconductor Corporation, has no objection to the reproduction by anyone of the patent document or the patent disclosure, as it appears in the U.S. Patent and Trademark Office files or records, but otherwise reserves all rights whatsoever.

BACKGROUND OF THE INVENTION

1. Field of the Invention

The present invention relates to very high frequency phase locked loops (PLLs) and, in particular, to techniques for generating a phase step in a continuous stream of data to test the response of a digital phase locked loop.

2. Discussion of the Related Art

The "testability" of an integrated circuit (IC) is a characteristic that effects the cost of the IC. Design of an IC for testability allows the status of the device to be determined, faults within the device to be isolated and device performance to be observed.

In the past, the testability of a phase locked loop (PLL) has included the generation of a phase step in the continuous stream of input data to the PLL. As shown in FIG. 1, the generation of a phase step in a continuous stream of data (Data_in) requires a programmed delay line 10 and a high speed multiplexer 12 for selecting data with a known phase shift based upon a select input signal (Phase_Select) to the multiplexer 12. The phase-shifted signal (Data_out) from the multiplexer 12 is provided to the data recovery PLL 14. The dynamic of the real time phase step response of the PLL 14 is observed using a phase meter 16, which is an instrument that converts any phase displacement into a corresponding voltage.

However, when the data rate exceeds 100 Mbits per second, the generation of a phase step in the input data to test the response of the PLL becomes a challenge requiring the design of a custom phase step generator.

Commonly-assigned U.S. Pat. No. 5,224,125, issued Jun. 29, 1993, discloses a signed phase-to-frequency (P-to-F) converter for use in a very high frequency PLL. Referring to FIG. 2, the quasi-digital, high frequency PLL 20 disclosed in the '125 patent includes a digital phase detector 22, a signed P-to-F converter 24, a 3-phase ring oscillator 26 and a frequency controlled oscillator (FCO) 28. FCO 28 and P-to-F converter 24 allow the use of a clock frequency which is no higher than the generating frequency of the PLL 20 to achieve acceptable phase resolution.

The P-to-F converter 24 converts the phase error information generated by the phase detector 22, which is in the form of UP, DOWN and HOLD signals, to multi-phase analog waveforms (PHASE 1, PHASE 2, PHASE 3) that are used to drive the FCO 28. The output frequency of the P-to-F converter 24 determines the locking range of the PLL 20. The phase error direction, either plus or minus, is represented by the phase relationship, either leading or lagging, of the multi-phase outputs of the P-to-F converter 24, which the FCO 28 interprets as either an increase, a decrease or no change in the operating frequency.

As shown in FIG. 3, the P-to-F converter 24 disclosed in the '125 patent includes a counting circuit 30 that converts the plus/minus phase error signal UD_PI provided by the phase detector 22 to a 7-bit count signal. The three most significant bits (MSB) of the count signal, i.e., the HI_CNT signal, are used by a 3-phase waveform generator 32 to generate a 3-phase sawtooth pattern. The four least significant bits (LSB) of the count signal, i.e., the LO_CNT signal, are utilized by a pulse density modulation (PDM) circuit 34 to generate a signal that indicates the binary weight of the LSB part of the count. The output of the LSB PDM circuit 34 and the 3-phase sawtooth pattern are applied to three MSB PDM circuits 36, 38, 40. The three carry outputs of the MSB PDM circuits 36, 38, 40 are the digital outputs of the P-to-F converter 24. Following buffering, the three digital outputs of the P-to-F converter 24 are converted to analog signals (PHASE 1, PHASE 2, PHASE 3) by RC filters. The plus/minus phase is indicated by the leading/lagging phase relationship among the output waveforms.

U.S. Pat. No. 5,224,125 is hereby incorporated by reference in its entirety.

A problem associated with the solution disclosed in the '125 patent is real time delay. That is, since generation of the 3-phase triangular waveform is within the PLL tracking loop, the time required for synthesis directly impacts upon the response time of the phase error correction, which increases the phase jitter of the recovered clock.

Commonly-assigned U.S. Pat. No. 5,646,967, issued Jul. 8, 1997 to Wong Hee and Gabriel Li, provides an improvement over the PLL system disclosed in the '125 patent.

Referring to FIG. 4, the '967 patent discloses a triangular waveform synthesizer 42 for a phase-to-frequency converter that generates a multi-phase triangular waveform using both Pulse Density Modulation (PDM) and a DC modulation scheme. The lower counter 44, upper counter 46 and lower PDM circuit 48 are similar to those utilized in the FIG. 3 waveform synthesizer. However, to minimize both delay and logic, while continuing to provide reasonable resolution, a 4-bit upper PDM circuit 50 and associated logic generates the PDM output waveform with polarity information and two switching waveforms that encode the DC level information to provide a resultant sum. The resulting waveform, after filtering, is the triangular waveform. Since the switching and adding of the DC levels occur in real time, the actual delay for the resultant triangular wave is only that of the 4-bit upper PDM circuit 50.

U.S. Pat. No. 5,646,967 is hereby incorporated by reference in its entirety.

The system disclosed in the '967 patent improves upon the system disclosed in the '125 patent. Both systems take advantage of Pulse Density Modulation techniques. The key advantage of the system disclosed in the '967 patent over the system disclosed in the '125 patent is its simplicity and short real time delay, which, as stated above, is a major factor in reducing the output jitter of the PLL.

A problem with the system disclosed in the '967 patent, however, is the relatively high energy of the third and higher harmonics of the triangular wave.

Commonly-assigned U.S. Pat. No. 5,651,036, issued Jul. 22, 1997 to Wong Hee and Gabriel Li, provides an improvement over both of the above-described systems.

Referring to FIG. 5, the '036 patent discloses a phase-to-frequency converter 52 that utilizes a triangular waveform synthesizer to generate a multi-phase triangular waveform using both Pulse Density Modulation (PDM) and a DC modulation scheme. The lower counter 54, upper counter 56, lower PDM circuit 58 and upper PDM circuit 60 are similar to those utilized in the FIG. 4 triangular waveform synthesizer. That is, a PDM and associated logic generates both the multi-phase PDM output waveform with polarity information and two switching waveforms that encode the DC level information to provide a resultant sum. The resulting waveform, after filtering, is the triangular waveform. However, as shown in FIG. 5, a wave modifier 62 modifies each triangular waveform by reducing the ramp rate at appropriate positions to suppress the third harmonic and its multiples. The ramp rate is proportional to the output of the Pulse Density Modulator. The rate of the PDM output is reduced by gating the output by the wave synthesizer clock signal, thereby reducing the density of the output by one half in the appropriate positions.

U.S. Pat. No. 5,651,036 is hereby incorporated by reference in its entirety.

Although the '036 patent discloses a PLL that substantially improves over the prior art, the response time of the PLL can still be improved.

Above-cited Related application Ser. No. 08/873,118 discloses a trapezoidal waveform synthesizer that converts a digital phase error signal into a plurality of phase-separated trapezoidal analog waveforms. The trapezoidal waveform synthesizer includes an up/down counter that counts the positive and negative phase errors and generates a multi-bit, parallel digital counter output signal that indicates a cumulative current value of the phase errors. The counter output signal includes a least significant bit (LSB) portion and most significant bit (MSB) portion. An upper PDM circuit converts the MSB portion of the counter output signal and a portion of the LSB portion of the counter output signal to a plurality of sets of serially-weighted multi-bit output signals. A lower PDM circuit converts the MSB and LSB portions of the counter output signal to a plurality of serially-weighted single-bit output signals. Each one of the sets of multi-bit outputs and a corresponding one of the single-bit outputs are provided to an RC circuit that converts the digital signal to an analog voltage. The waveform synthesizer thereby provides a plurality of phase-separated trapezoidal waveforms.

SUMMARY OF THE INVENTION

The present invention provides a method and circuitry for generating a single 30 or 60 degree phase shift in the recovered clock in a high speed, digital data recovery phase locked loop. Since this injection can be done in a closed loop environment, the dynamic of the real time phase step response of the PLL can be analyzed using a phase meter. In an open-loop environment, the output of the phase meter with a step response of 60 degree phase shift tracks closely with the internal RC response at the multi-phase outputs of the PLL's phase-to-frequency converter. Since the resistor and capacitor values vary with process, the invention provides a scheme for verifying the relative accuracy of the PLL's internal filters without actually probing the device.

These and other features and advantages of the present invention will be better understood and appreciated upon consideration of the following detailed description and the accompanying drawings which set forth an illustrative embodiment in which the principles of the invention are utilized.

DETAILED DESCRIPTION OF THE INVENTION

Figure 6:
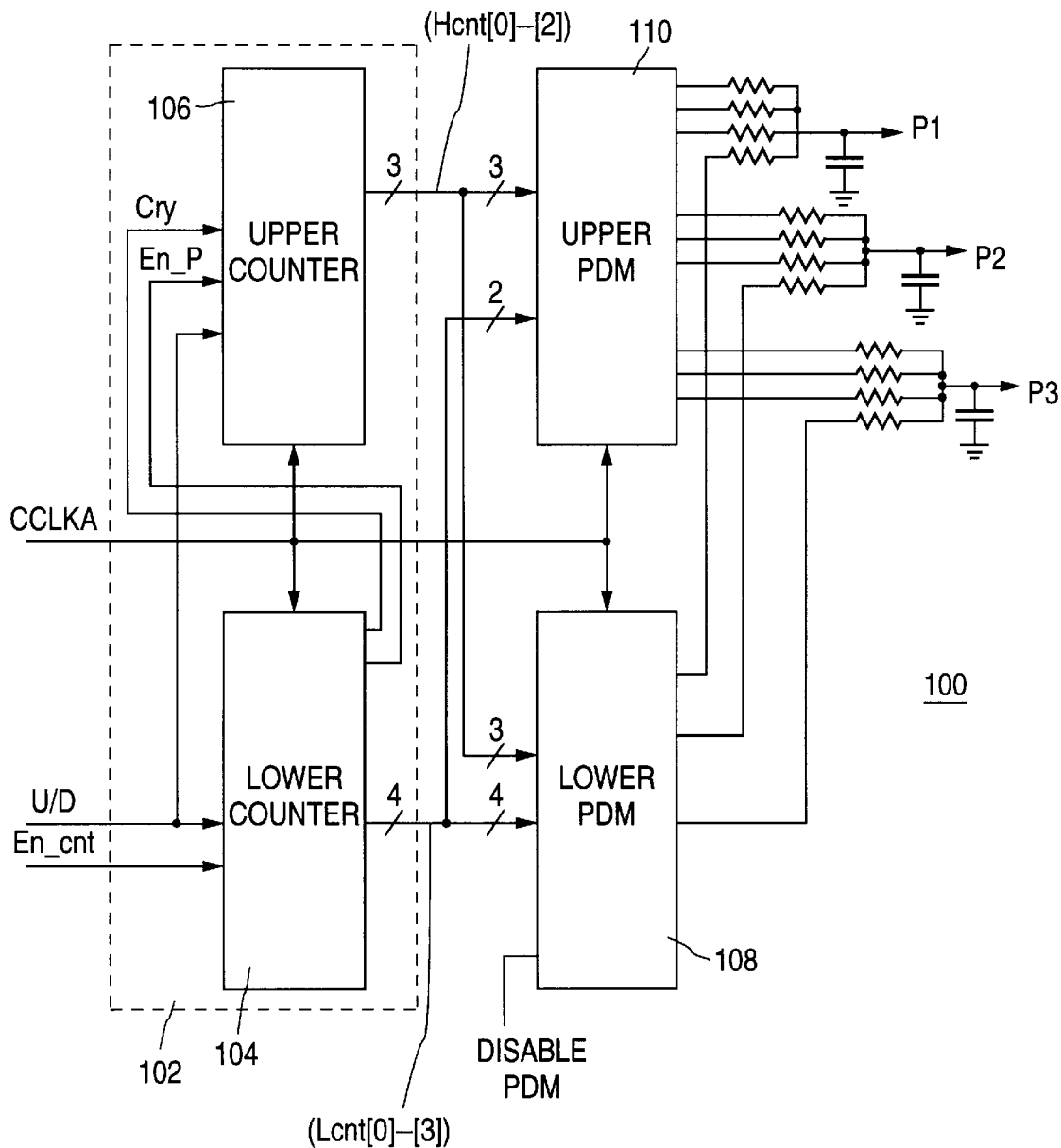
FIG. 6 is a block diagram illustrating a multi-phase trapezoidal waveform synthesizer disclosed in U.S. Pat. No. 5,943,379 that may be utilized in the FIG. 2 PLL.

FIG. 6 shows a block diagram of a 3-phase trapezoidal waveform synthesizer 100 disclosed in above-cited related U.S. Pat. No. 5,943,379. The trapezoidal waveform synthesizer 100 can be used to replace the P-to-F converter 24 in the FIG. 2 PLL circuit 20.

Figure 1:
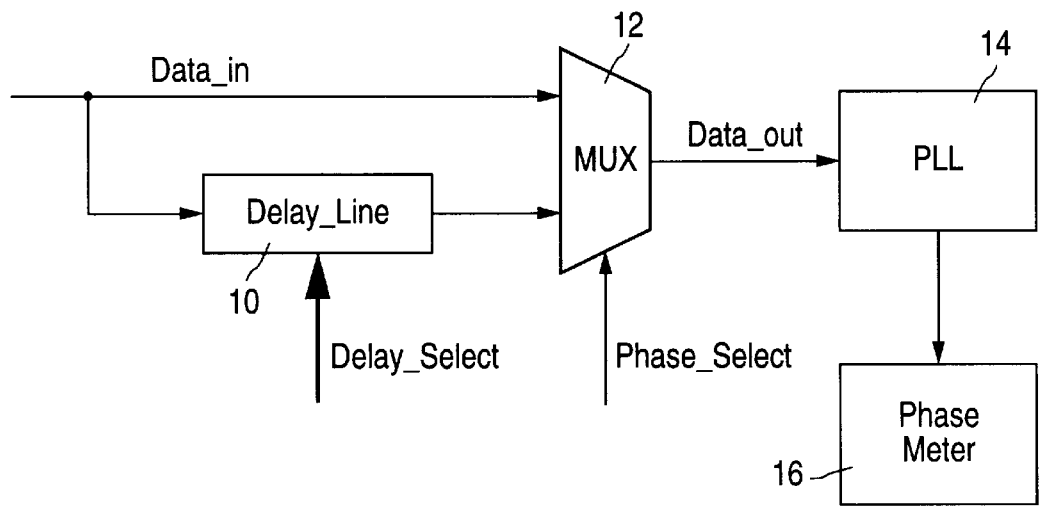
FIG. 1 is a block diagram illustrating a conventional system for generating a phase step signal for testing a phase locked loop.
Figure 2:
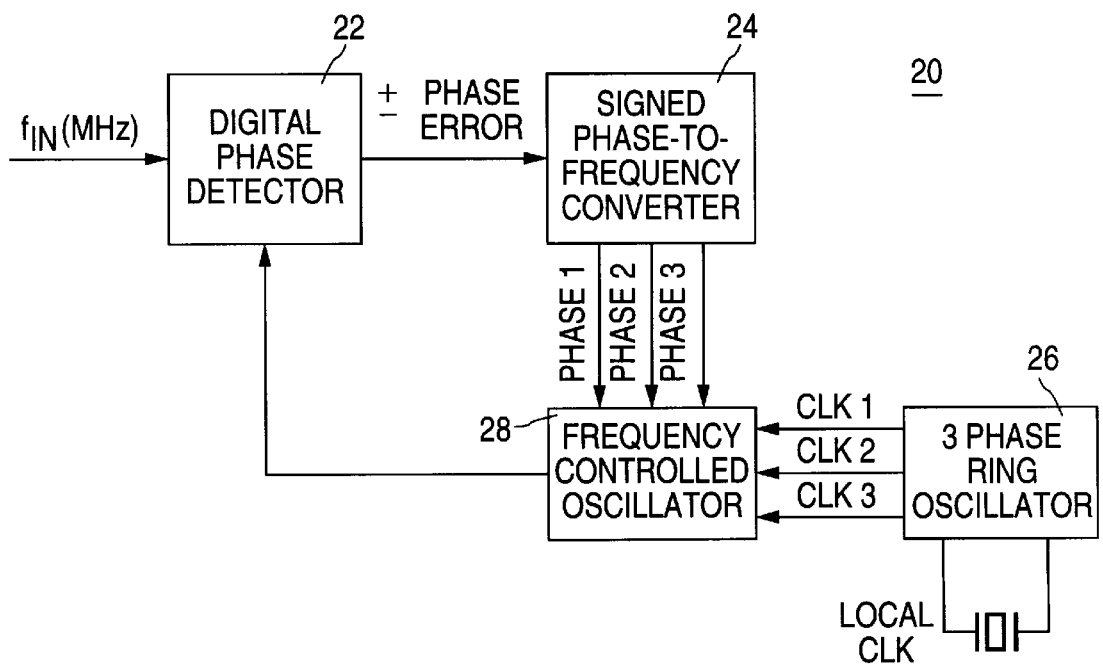
FIG. 2 is a block diagram illustrating a known digital phase locked loop.
Figure 3:
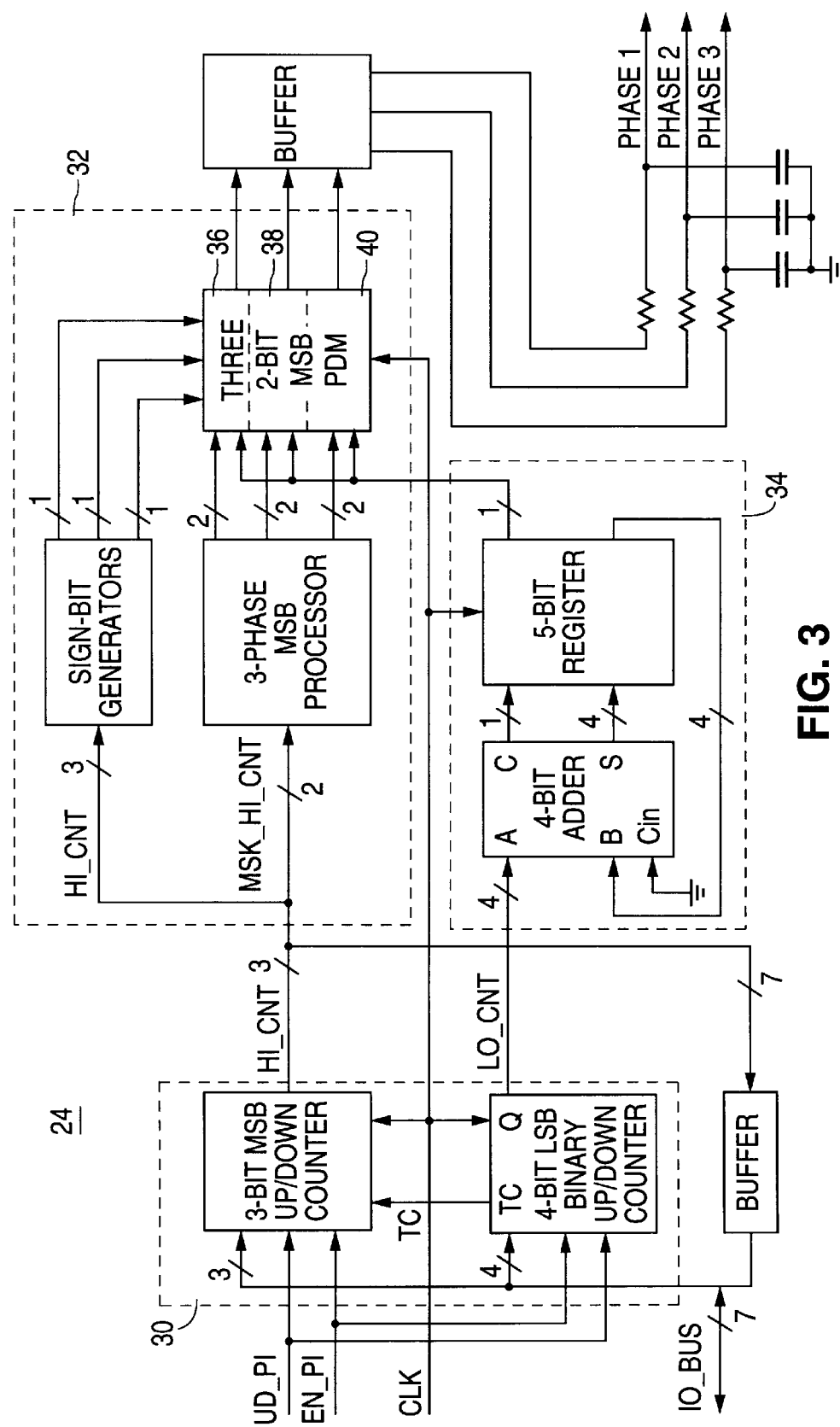
FIG. 3 is a block diagram illustrating a phase-to-frequency converter disclosed in U.S. Pat. No. 5,224,125 and that may be utilized in the FIG. 2 PLL.
Figure 4:
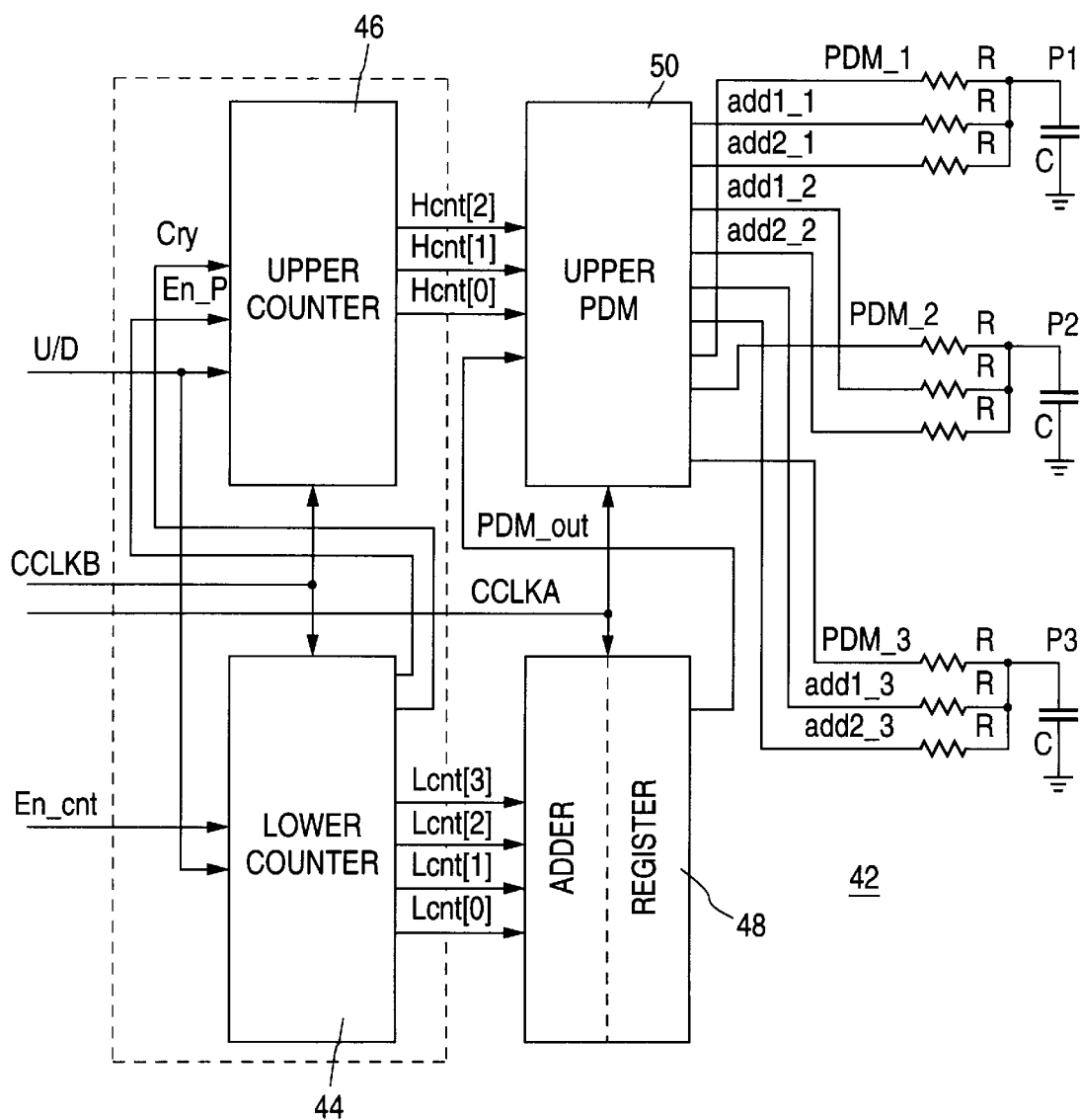
FIG. 4 is a block diagram illustrating a three-phase triangular wave synthesizer disclosed in U.S. Pat. No. 5,646,967 and that may be utilized in the FIG. 2 PLL.
Figure 5:
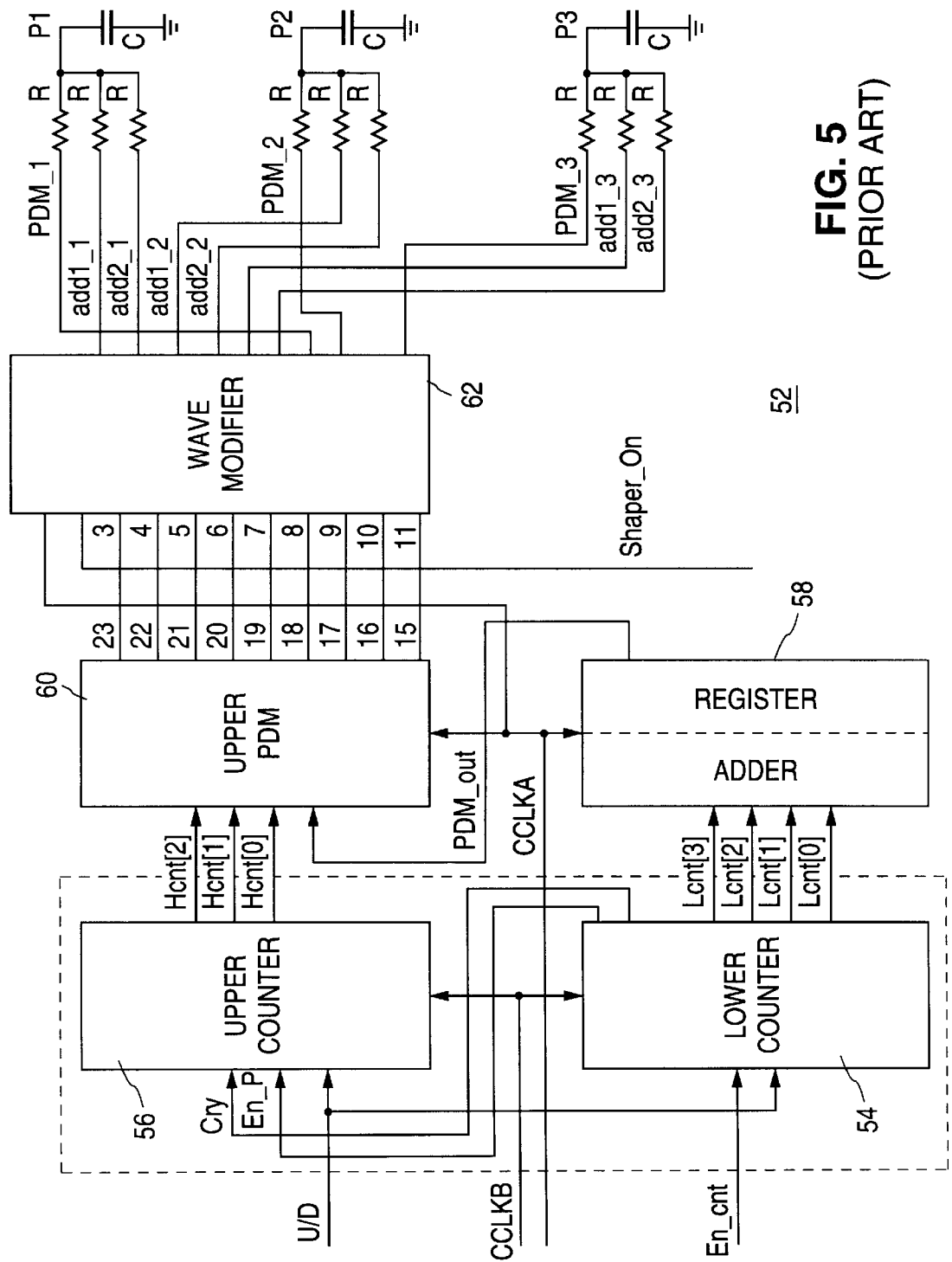
FIG. 5 is a block diagram illustrating a three-phase waveform synthesizer with third harmonic suppression disclosed in U.S. Pat. No. 5,651,036 and that may be utilized in the FIG. 2 PLL.

As shown in FIG. 6, the trapezoidal waveform synthesizer 100 receives two signals, an up/down signal U/D that represents the ± phase error quantities generated by the digital phase detector 22 (FIG. 2) and a count enable signal En_cnt. Input signal U/D controls the count direction of an up/down counter 102, causing the counter 102 to count up when U/D=logic "1" and to count down when U/D=logic "0". The count enable signal En_cnt enables the counter 102 when in logic "1" and stops the counter 102 when in logic "0". Clock signal CCLKA is derived from the output of 3-phase ring oscillator 26 (FIG. 2).

Counter 102 may be a conventional up/down counter viewed as a lower 4-bit LSB binary up/down counter 104 and an upper 3-bit MSB binary up/down counter 106. The lower 4-bit counter 104 receives both the phase error signal U/D and the enable signal En_cnt. Thus, lower counter 104 stops if En_cnt=0. The carry output signal Cry of the 4-bit lower counter 104 and a carry enable signal En_P are fed into the upper 3-bit counter 106 that counts from 0 to 5.

The lower counter 104 generates a four-bit LSB output (Lcnt[0]–[3]) that is provided to a lower PDM circuit 108.

Bits [2] and [3] of the LSB output are provided to an upper PDM circuit 110. The upper counter 106 generates a three-bit MSB output (Hcnt[0]–[2]), representing count 0–5, that is provided to the lower PDM circuit 108 and to the upper PDM circuit 110.

As further shown in FIG. 6, the upper PDM circuit 110 generates three sets of 3-bit serially weighted outputs, each of which is combined with a corresponding one of three single-bit serially weighted outputs generated by the lower PDM circuit 108. The three sets of 4-bit serially weighted outputs are then converted from digital to analog signals by RC circuits to provide three trapezoidal waveform outputs P1, P2, P3 that are phase aligned 120 degrees apart.

More detail regarding the implementation of the lower counter 102 and the upper counter 106 is provided in file ptf_lcnt.c and file ptf_hcnt.c, respectively, of attached Appendix A, which is an integral part of this patent specification.

Descriptions of an implementation of the lower PDM circuit 108 and of the upper PDM circuit 110 are provided by the gal equations provided in file ptf_ldac.c and file ptf_hdac.c, respectively, in attached Appendix A.

Figure 7:
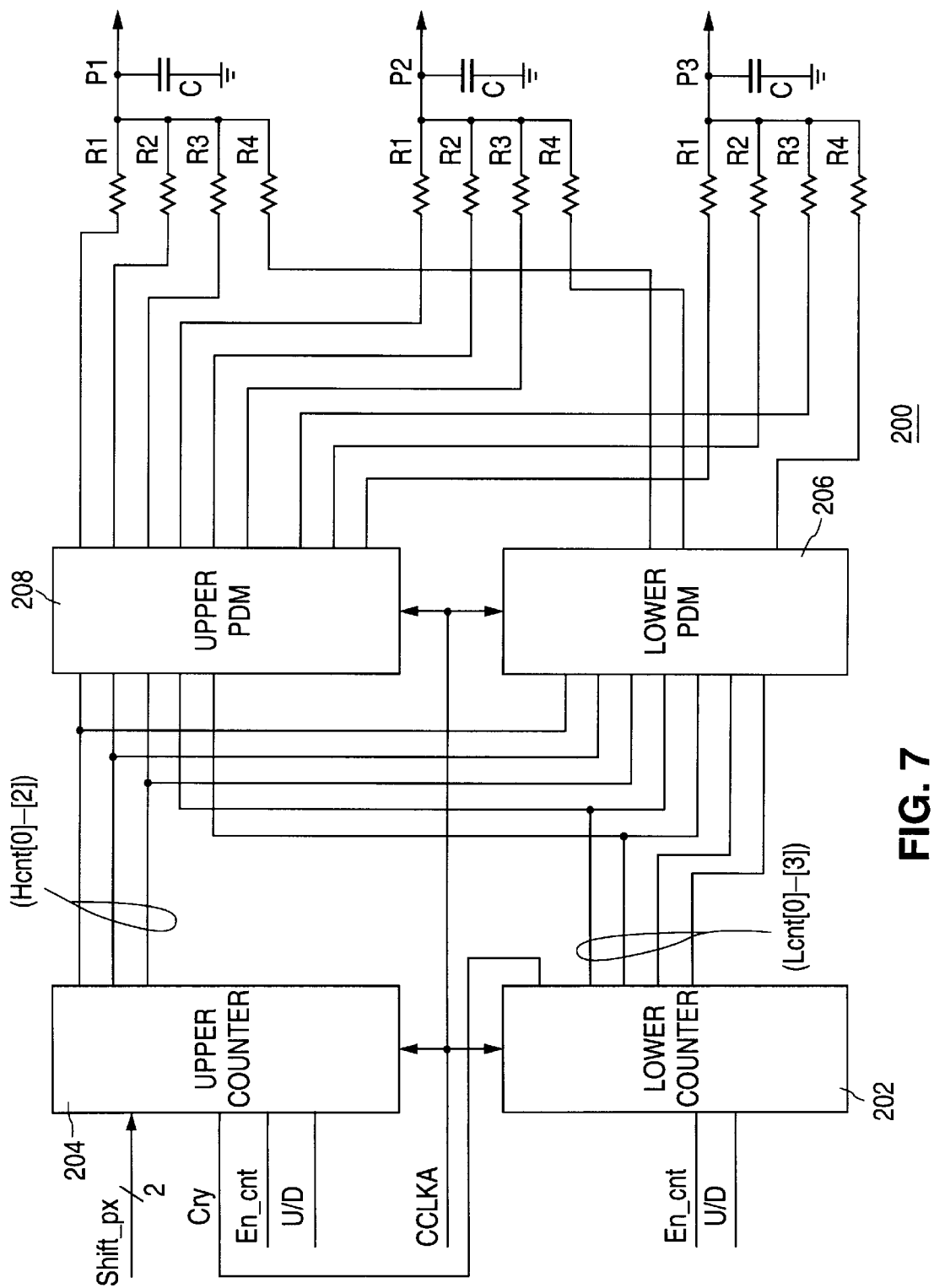
FIG. 7 is a block diagram illustrating a three-phase trapezoidal waveform synthesizer with built-in phase step generator in accordance with the present invention that may be utilized in the FIG. 2 PLL.

FIG. 7 shows a block diagram of a phase-to-frequency (P-to-F) converter circuit 200 that includes a 3-phase trapezoid waveform synthesizer with a built-in phase step generator in accordance with the present invention. The P-to-F converter circuit 200 is similar to the FIG. 6 circuit 100 and can be used to replace the P-to-F converter in the PLL circuit described in each of the above-cited '125 Wong et al. patent, '967 Wong et al. patent, the '036 Wong et al. patent and Wong et al. U.S. Pat. No. '579.

To simplify the description of the P-to-F converter circuit 200, only the required input signals are explained in detail. The ± phase error quantities generated by the digital phase detector 22 (FIG. 2) of the associated PLL 20 (FIG. 2) are represented by the up/down input signal U/D. Input signal U/D controls the count direction of both lower counter 202 and upper counter 204 (counts up when U/D=logic "1" and counts down when U/D=logic "0").

The lower 4-bit binary up/down counter 202 receives both the phase error signal U/D and the enable signal En_cnt. Thus, lower counter 202 stops if En.cnt=0. The carry output signal Cry of the 4-bit lower counter 202 is fed into the upper 3-bit counter 204 that counts from 0 to 5. Both the lower counter 202 and the upper counter 204 are driven by the CCLKA clock input signal, which is derived from the output of a 3-phase ring oscillator 26 (see FIG. 2).

The lower counter 202 generates a 4-bit LSB output (Lcnt[0]–[3]) that is provided as an input to a lower 4-bit PDM circuit 206 that operates in a manner similar to that described in the above-cited related application. That is, lower PDM circuit 206 comprises a 4-bit adder and a 5-bit register; the output of the 4-bit adder is connected to the input of the 5-bit register. Thus, the lower PDM circuit 206 adds the previous contents of the register to the current value of the LSB output (Lcnt[0]–[3]) of the lower counter 202. The operation is repetitious at every cycle of the CCLKA clock input.

As shown in FIG. 7, the upper counter 204 generates a 3-bit MSB output (Hcnt[0]–[2]), representing count 0–5, that is provided to the lower PDM circuit 206 and to the upper PDM circuit 208.

As further shown in FIG. 7, the upper PDM circuit 208 generates three sets of 3-bit serially weighted outputs, each of which is combined with a corresponding one of three single-bit serially weighted outputs generated by the lower PDM circuit 206. The three sets of 4-bit serially weighted outputs are then converted from digital to analog signals by RC circuits to provide three trapezoidal waveform outputs P1, P2 and P3 that are phase-aligned 120 degrees apart.

The logic for implementing the 30 or 60 degree phase step is described in C language which is included in Appendix A of this document under the file name of ptf_hcnt.c.

Referring to Appendix A, each count is a phase shift of 30 degree. The statement:

case SHIFT_30: hicnt_out+=1;

means to add 1 to the current content of the upper counter 204, which counts from 0 to 5.

Similarly, the statement.

case SHIFT_60: hicnt_out+=2;

means to add 2 to the current content of the upper counter 204, resulting in 60 degree change in phase. The logic that converts the counter value to actual phase shift is described in above-cited Related U.S. Pat. No. 5,943,379 and its Appendix A.

With reference to FIG. 7, the two bit Shift-px input to the upper counter 204 controls the amount of the phase shift: when the code is "00", there is no phase shift; codes "01" and "11" mean a 30 degree shift, and code "10" means a 60 degree shift.

Figure 8:
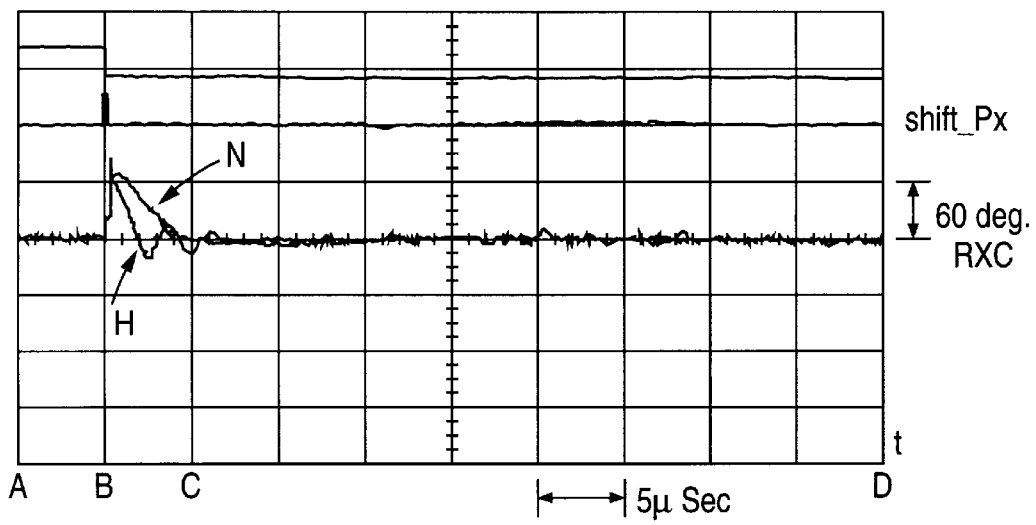
FIG. 8 provides an oscilloscope display of the response of the FIG. 7 wave synthesizer to a 60 degree phase step.

FIG. 8 shows the scope display of a 60 degree phase step. Before time step A, the control bit is 10 which represents a 60 degree phase step signal has been injected into the loop. At the step A, the recovered clock RXC tracks out the injected phase error and stays at the current phase value. During time step B, the control bits step through a sequence of codes (10-11-01-00) in order to remove the injected phase error from the loop. When the code is 00, there is no phase error injected into the loop. The recovered clock RXC responds to the removal of the phase step error signal and has a current phase value of 60 degrees from its previous value. This phase disturbance puts the loop in the starting stage of a "phase recovery" state. The duration of the "phase recovery" depicts the phase response of the system. FIG. 8 shows two overlaid traces H and N from the output of the phase meter. Trace H shows the phase recovery time when the loop has been configured in the high speed tracking mode. Trace N shows the phase recovery time when the loop has been configured in the normal operating mode.

In many processes, it is difficult to measure the effect of the RC variation if both R and C are not accessible from the input/output pins of the PLL. Any external monitoring of any internal nodes which are process critical is a test benefit.

Figure 9:
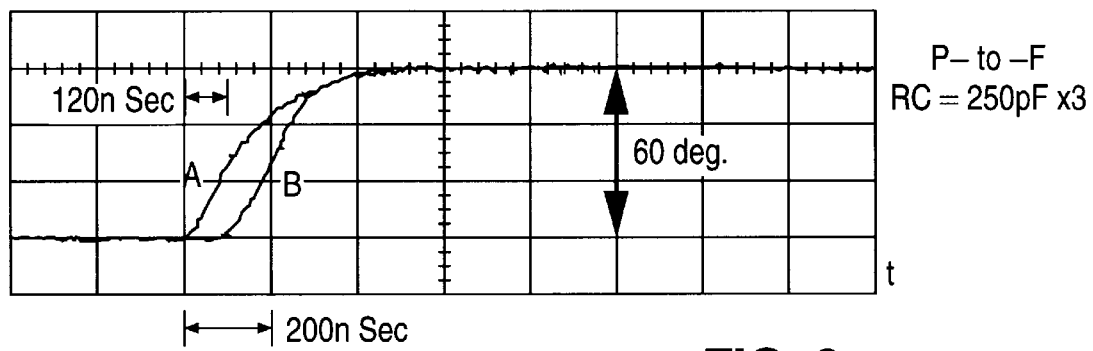
FIG. 9 provides an oscilloscope display of the open loop response of the FIG. 7 wave synthesizer to a 60 degree phase step when c=250 pf.

FIG. 9 shows a trace A which is a direct probing of P1 when C=250 pf and the output of the phase meter plus the effect of the internal operation amplifier buffers (trace B) when the loop is open and a 60 degree phase error has been injected.

Figure 10:
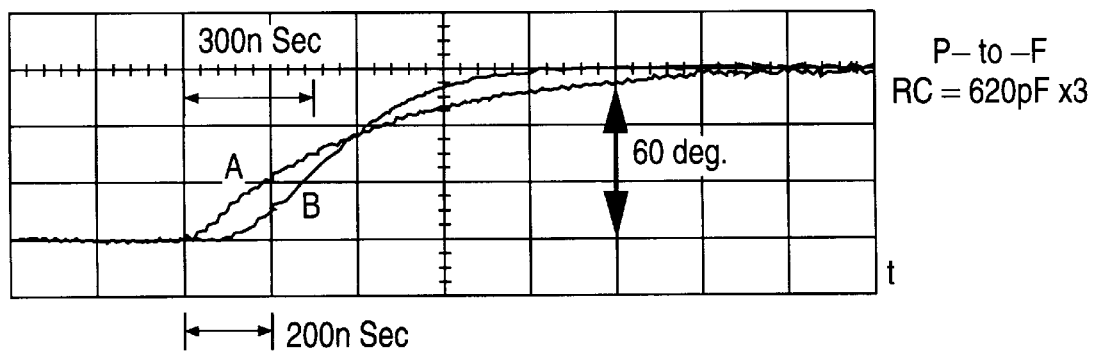
FIG. 10 provides an oscilloscope display of the loop response of the FIG. 7 wave synthesizer to a 60 degree phase step when c=620 pf.

FIG. 10 is similar to FIG. 9 with the value of the capacitors C in the FIG. 7 embodiment increased to 620 pf. Note that the A and B traces in both FIG. 9 and FIG. 10 have a similar time constant. This open-loop phase step response can be used to monitor the process variation of the on-chip RC filters, as shown in FIG. 7.

A description of the logic implementation of the upper PDM circuit 208 follows. For an actual implementation of upper PDM circuit 208, reference is made to the gal equations provided in Appendix A.

The core of the logic of the upper PDM circuit 208 is a decoder from count 0 to count 5 of the output of upper counter 204. The logic equations of the three outputs of the upper PDM circuit 108 are as follows:

add1=((count>=1)&&(count<=4)) ?(1):(0)

add2=((count>=2)&&(count<=3)) ?(1):(0)

PDM_1=invt^PDM_out invt=((count>=3)&&(count<=5)) ?(1):(0)

The signal add1 is asserted during counts 1, 2, 3, and 4. The signal add2 is asserted during counts 2 and 3. PDM_1 is the PDM_out during count 0, 1, and 2 while during count 3, 4, and 5 the PDM_out is inverted.

To generate phase 2 (p2) of the trapezoidal wave, the counter value must be offset by 2, which translates to a 120 degree phase shift. Similarly, offsetting the counter value by 4 provides a 240 degree phase shift for the phase 3 (p3) of the trapezoidal wave.

As stated above, the HDL description of the design and the actual gal equations are attached as part of Appendix A.

It should be understood tha various alternatives to the embodiments of the invention described herein may be employed in practicing the invention. It is intended that the following claims define the scope of the invention and that structures and methods within the scope of these claims and their equivalents be covered thereby.

What is claimed is:

1. Apparatus for generating a phase step in a continuous stream and data to test the response of a digital phase locked loop, the apparatus including a waveform synthesizer that converts a digital phase error signal that indicates positive and negative phase errors into a plurality of phase-separated waveforms, the apparatus comprising:

an up/down counter that counts the positive and negative phase errors and generates a multi-bit, parallel digital counter output signal that indicates a cumulative current value of the phase errors, the counter output signal including a least significant bit (LSB) portion and a most significant bit (MSB) portion;

means for modifying the MSB portion of the counter output signal to provide a modified MSB portion representative of a selected phase step;

an upper pulse density modulation (PDM) circuit that converts the modified MSB portion of the counter output signal and a portion of the LSB portion of the counter output signal to provide a plurality of sets of serially-weighted multi-bit output signals;

a lower pulse density modulation (PDM) circuit that converts the modified MSB portion of the counter output signal and the LSB portion of the counter output signal to a plurality of serially-weighted single-bit output signals; and a plurality of RC circuits, each RC circuit being connected to receive one of the plurality of single-bit output signals and a corresponding one of the sets of multi-bit output signals and to provide a corresponding plurality of phase-separated waveforms.

2. Apparatus for generating a phase step in a continuous stream of data to test the response of a digital phase locked loop, the apparatus including a trapezoidal waveform synthesizer that converts a digital phase error signal that indicates positive and negative phase errors into three phase-separated trapezoidal waveforms, the trapezoidal waveform synthesizer comprising:

an up/down counter that counts the positive and negative phase emits and generates a 7-bit parallel digital counter output signal that indicates a cumulative current value at the phase emits, the counter output signal including a 4-bit least significant bit (LSB) portion and a 3-bit most significant bit (MSB) portion, the MSB portion representing count 0–5;

means for modifying the MSB portion of the counter output signal to provide a modified MSB portion representative of a selected phase step;

an upper pulse density modulation (PDM) circuit that combines the modified MBS portion and the upper two bits of the LSB portion of the counter output signal to provide three sets of serially-weighted 3-bit output signals;

a lower PDM circuit that converts the modified MSB portion and LSB portion as the counter output signal to three serially-weighted single-bit output signals; and three RC circuits, each RC circuit adapted to receive one of the 3-bit outputs and a corresponding one of the single-bit outputs and to generate a corresponding analog trapezoidal waveform such that the trapezoidal waveform synthesizer generates three phase-separated analog trapezoidal waveforms.

3. A trapezoidal waveform synthesizer as in claim 2 and wherein the trapezoidal waveforms are phase-separated by 120°.

4. An apparatus as in claim 2 and wherein the selected phase step is 30°.

5. An apparatus as in claim 2 and wherein the selected phase step is 60°.

6. A method of generating a phase step in a continuous stream of data to test the response of a digital phase locked loop, the method comprising:

providing a digital phase error signal that indicates positive and negative phase errors;

counting the positive and negative phase errors to generate a multi-bit parallel count signal that indicates a cumulative current value of the phase errors, the count signal including a least significant bit (LSB) portion and a most significant bit (MSB) portion;

modifying the MSB portion of the signal to provide a modified MSB portion representative of a selected phase step;

utilizing pulse density modulation to convert the modified MSB portion of the count signal and a portion of the LSB portion of the count signal to a plurality of sets of serially-weighted multi-bit output signals;

converting the modified MSB portion and the LSB portion of the count signal to a plurality of serially-weighted single-bit output signals;

combining each one of the plurality of sets of multi-bit output signals with a corresponding one of the plurality of single-bit output signals to serve as inputs to a corresponding RC circuit to provide a corresponding analog trapezoidal waveform whereby a plurality of phase-separated analog trapezoidal waveforms are provided.

* * * * *